United States Patent
Tappura et al.

(10) Patent No.: US 12,013,287 B2
(45) Date of Patent: Jun. 18, 2024

(54) INFRARED ABSORPTION AND DETECTION ENHANCEMENT USING PLASMONICS

(71) Applicant: TEKNOLOGIAN TUTKIMUSKESKUS VTT OY, Espoo (FI)

(72) Inventors: Kirsi Tappura, Espoo (FI); Tomi Haatainen, Espoo (FI); Tapio Mäkelä, Espoo (FI)

(73) Assignee: TEKNOLOGIAN TUTKIMUSKESKUS VTT OY, Espoo (FI)

(*) Notice: Subject to any disclaimer, the term of this patent is extended or adjusted under 35 U.S.C. 154(b) by 474 days.

(21) Appl. No.: 17/593,715

(22) PCT Filed: Mar. 23, 2020

(86) PCT No.: PCT/FI2020/050183
§ 371 (c)(1),
(2) Date: Sep. 23, 2021

(87) PCT Pub. No.: WO2020/193857
PCT Pub. Date: Oct. 1, 2020

(65) Prior Publication Data
US 2022/0155150 A1    May 19, 2022

(30) Foreign Application Priority Data
Mar. 25, 2019   (FI) .................................... 20195217

(51) Int. Cl.
*G01J 5/04*     (2006.01)
*G01J 5/08*     (2022.01)
(Continued)

(52) U.S. Cl.
CPC ............. *G01J 5/046* (2013.01); *G01J 5/0853* (2013.01); *G02B 5/008* (2013.01); *G02B 5/208* (2013.01);
(Continued)

(58) Field of Classification Search
CPC .... A61F 2/07; A61F 2/856; A61F 2/89; A61F 2/915; A61F 2/954; A61F 2002/061;
(Continued)

(56) References Cited

U.S. PATENT DOCUMENTS

| 2014/0069496 A1 | 3/2014 | Biswas et al. |
| 2015/0362374 A1 | 12/2015 | Wheeler et al. |
| 2016/0365463 A1 | 12/2016 | Lee et al. |

FOREIGN PATENT DOCUMENTS

| CN | 109 095 435 | 12/2018 |
| DE | 10 2013 109143 | 2/2015 |

(Continued)

OTHER PUBLICATIONS

International Search Report for PCT/FI2020/050183 mailed Jul. 16, 2020, 4 pages.
(Continued)

*Primary Examiner* — David P Porta
*Assistant Examiner* — Meenakshi S Sahu
(74) *Attorney, Agent, or Firm* — Nixon & Vanderhye PC

(57) ABSTRACT

According to an aspect, there is provided a structure comprising an absorbing layer for absorbing incident infrared radiation received via a receiving surface of the absorbing layer and a plurality of mushroom-shaped plasmonic elements for enhancing absorption of the incident infrared radiation into the absorbing layer. Said plurality of mushroom-shaped plasmonic elements have sub-wavelength dimensions and sub-wavelength spacings and are arranged along the receiving surface. Each of said plurality of mushroom-shaped plasmonic elements project out relative to the receiving surface.

15 Claims, 6 Drawing Sheets

(51) Int. Cl.
*G02B 5/00* (2006.01)
*G02B 5/20* (2006.01)
*H01L 31/0232* (2014.01)
*H01L 31/028* (2006.01)
*H01L 31/0296* (2006.01)
*H01L 31/0304* (2006.01)
*H01L 31/032* (2006.01)
*H01L 31/18* (2006.01)

(52) U.S. Cl.
CPC ........ *H01L 31/02327* (2013.01); *H01L 31/18* (2013.01); *H01L 31/028* (2013.01); *H01L 31/02966* (2013.01); *H01L 31/0304* (2013.01); *H01L 31/03046* (2013.01); *H01L 31/0324* (2013.01)

(58) Field of Classification Search
CPC .......... A61F 2002/075; A61F 2002/826; A61F 2210/0014; A61F 2250/0039
See application file for complete search history.

(56) References Cited

FOREIGN PATENT DOCUMENTS

| | | |
|---|---|---|
| GB | 2554672 | 4/2018 |
| WO | 2014/005147 | 1/2014 |

OTHER PUBLICATIONS

Written Opinion of the ISA for PCT/FI2020/050183 mailed Jul. 16, 2020, 7 pages.
Search Report for FI20195217 dated Sep. 17, 2019, one (1) pages.

INFRARED ABSORPTION AND DETECTION ENHANCEMENT USING PLASMONICS

This application is the U.S. national phase of International Application No. PCT/FI2020/050183 filed Mar. 23, 2020 which designated the U.S. and claims priority to FI Patent Application No. 20195217 filed Mar. 25, 2019, the entire contents of each of which are hereby incorporated by reference.

TECHNICAL FIELD

The invention relates to infrared absorption and detection.

BACKGROUND

The following description of background art may include insights, discoveries, understandings or disclosures, or associations together with disclosures not known to the relevant art prior to the present invention but provided by the invention. Some such contributions of the invention may be specifically pointed out below, whereas other such contributions of the invention will be apparent from their context.

Infrared detectors, that is, devices for detecting electromagnetic radiation in the infrared frequency range, are commonly used in a variety of applications such as night vision devices, infrared telescopes and missile guidance systems for tracking. Especially, the safety and security applications (e.g., infrared cameras for day and night monitoring) impose many critical challenges on future high-end infrared detectors and imaging cameras that are not fully met by the available commercial infrared (IR) systems. In addition to the constant demand for better performance (e.g., in terms of sensitivity, thermal resolution and/or pixel density), improvements in the usability of the high-end sensors are desired (e.g., smaller size and/or less cooling). In spite of the widely available commercial photonic (or quantum) and thermal detectors (i.e., bolometers), there is still a need especially for high-end IR imaging systems that combine an excellent performance, reasonable price and convenient operation (i.e., less cooling required), while the lower-end detectors lack a convenient, cost-effective method to improve the thermal resolution.

Different solutions are available for different spectral ranges within the infrared frequency range though they all have their disadvantages. High-end IR detectors for the 5-14 µm spectral range require efficient cooling to reduce thermal noise, especially for the longer wavelengths, which makes the corresponding IR detection systems bulky, prone to breakage and inconvenient to use. For the 6-14 µm spectral range (or even the 3-14 µm spectral range) mercury cadmium telluride (HgCdTe) materials are typically used. As HgCdTe has a high refractive index (close to 4 with high Hg content) resulting in a considerable part of the incident infrared radiation being lost (i.e., being undetected) due to reflections, an efficient broadband antireflection coating needs to be designed and used on top of the HgCdTe material to achieve satisfactory performance. Currently, conventional, mostly non-optimal thin-film stacks are used for this purpose. Regarding lower infrared wavelengths, PbS is a standard semiconductor infrared detector for 1-3.3 µm wavelengths whereas PbSe is used in the range of 1-4.7 µm when uncooled and up to 5.2 µm when cooled. However, the refractive indices of these materials are ever higher that the refractive index of HgCdTe (approx. 4-5) resulting in even more reflections.

BRIEF DESCRIPTION

The following presents a simplified summary of features disclosed herein to provide a basic understanding of some exemplary aspects of the invention. This summary is not an extensive overview of the invention. It is not intended to identify key/critical elements of the invention or to delineate the scope of the invention. Its sole purpose is to present some concepts disclosed herein in a simplified form as a prelude to a more detailed description.

An aspect of the present invention is to provide an efficient solution for infrared absorption enhancement using plasmonic structures. Specifically, embodiments of the invention present an improvement over the prior art relating to the coupling or concentrating of incident infrared radiation (or infrared radiation within a pre-defined frequency range) efficiently to an infrared absorbing (or active) layer. The absorbing layer may be comprised, for example, in an infrared (photo)detector. The improved coupling is achieved in the embodiments by arranging a plurality of sub-wavelength plasmonic elements having a mushroom shape on top of the absorbing layer so as to incite a localized surface plasmon-polariton wave mode in the sub-wavelength plasmonic elements at the operating infrared frequencies. Electric fields near the sub-wavelength plasmonic elements are enhanced and heavily confined to the interface between the two materials resulting in improved absorption in the absorbing layer. The plasmonic layer has the further benefit of acting as a broadband antireflection coating resulting in minimized reflections and enhanced photon paths in the absorbing layer due to the beneficial scattering into the absorbing layer. The plurality of sub-wavelength plasmonic elements may be metallic, metallized or heavily-doped semiconductor elements having a mushroom-like shape with a narrow bottom section (e.g., similar to a stalk, stipe or stem of a mushroom) and a wider, possibly rounded, top section (e.g., similar to a cap of a mushroom).

Another aspect of the present invention is to provide a method for manufacturing an infrared absorber or detector arrangement (preferably as described in the previous paragraph).

According to an aspect, there is provided the subject matter of the independent claims. Embodiments are defined in the dependent claims.

One or more examples of implementations are set forth in more detail in the accompanying drawings and the description below. Other features will be apparent from the description and drawings, and from the claims.

BRIEF DESCRIPTION OF DRAWINGS

In the following, exemplary embodiments will be described with reference to the attached drawings, in which.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Figure 1A:
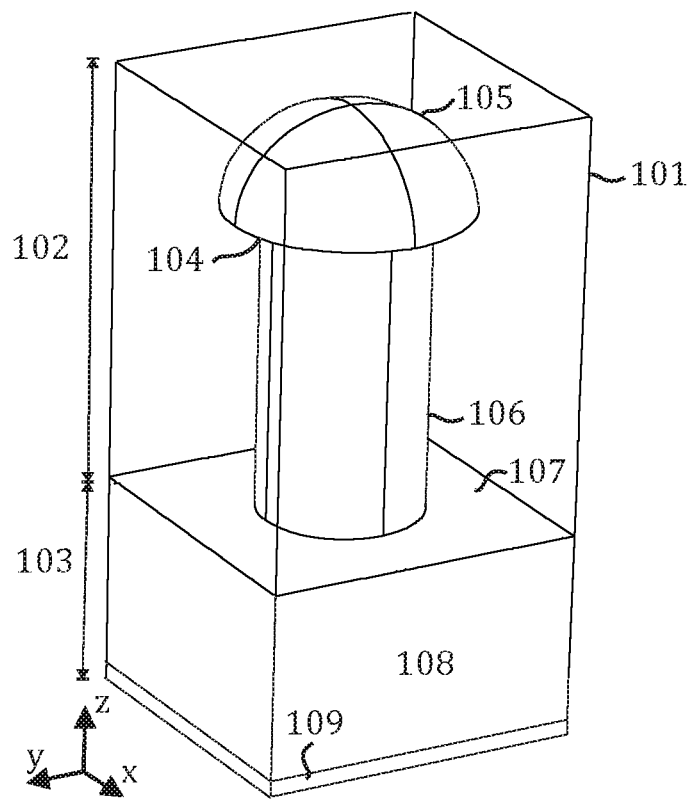
FIGS. 1A, 1B and 1C illustrate a unit cell of an exemplary infrared detector arrangement according to an embodiment from three different viewpoints.
Figure 1B:
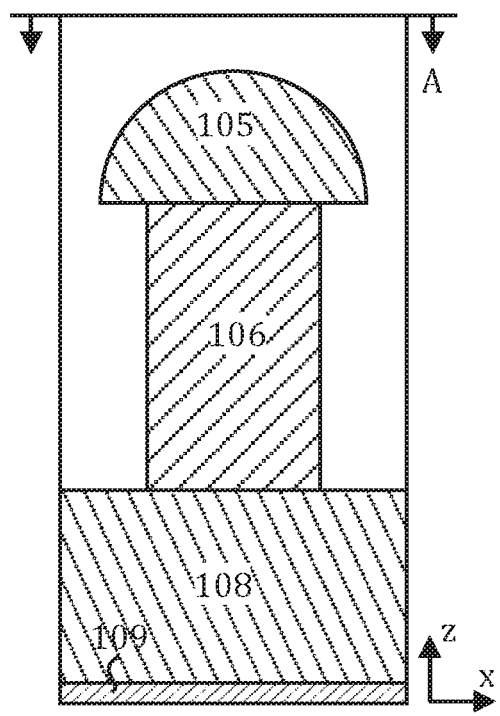
Figure 1C:
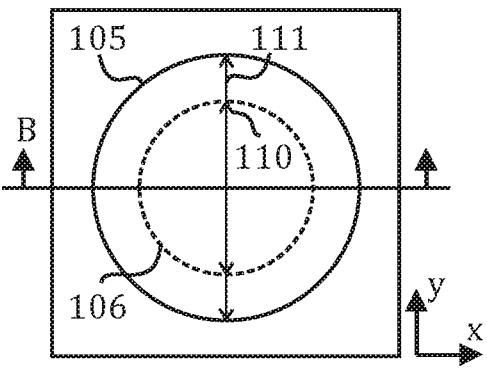

FIGS. 1A, 1B and 1C illustrate an exemplary structure (infrared detector arrangement) according to an embodiment. Specifically, FIGS. 1A, 1B and 1C illustrate a single unit cell of a periodic structure, that is, a structure periodic in two orthogonal directions (x and y directions). A practical infrared detector arrangement according to embodiments may comprise N unit cells along the x-direction and M unit cells along the y-direction, where N and M may be any positive integers. In most practical scenarios, N and M are very large numbers. FIGS. 1A, 1B and 1C illustrate the same unit cell 101 of an infrared detector arrangement from three different viewpoints: FIG. 1A provides a perspective view of the infrared detector arrangement, FIG. 1B shows a cross-sectional view (i.e., a view of the central xz-plane) and FIG. 1C shows a view from "above" (i.e., a view of the xy-plane). FIG. 1B corresponds to the cut-plane B visible in FIG. 1C and FIG. 1C corresponds to the cut-plane A visible in FIG. 1B. In FIG. 1C, a dashed line is used for indicating geometry not visible from the point of view of said Figure (i.e., geometry obstructed from view by other geometry). In the illustrated example, the infrared detector arrangement is configured to receive infrared radiation from "above". In other words, the infrared electromagnetic waves which are incident upon the infrared detector arrangement have a wave vector with a negative z-component. The x- and y-components of the wave vector may have any sign and magnitude.

The unit cell 101 of the infrared detector arrangement illustrated in FIGS. 1A, 1B and 1C comprises two main elements: an infrared detector 103 and a plasmonic (metamaterial) layer 102 arranged above the infrared detector and comprising a plurality of sub-wavelength plasmonic elements 104 having a mushroom shape. In the following, the operation and properties of the infrared detector 103 (that is, a conventional infrared detector) is discussed first, followed by discussion on how embodiments enhance the performance of said infrared detector using the plasmonic layer 102 (i.e., the plurality of mushroom-shaped plasmonic elements 104).

The infrared detector 103 may specifically be a photonic infrared detector (i.e., an infrared photodetector). Infrared photodetectors are based on employing semiconductor materials with narrow band gaps for absorbing the incident infrared radiation, that is, for converting, using a p-n junction of the semiconductor, incident photons in the infrared range into current which is then collected by the measurement system. Alternatively, the infrared detection may be based on measuring the changes in conductivity of a semiconductor (so-called photoconductors). The infrared detector 103 used may be any conventional infrared photodetector comprising an absorbing (semiconductor) layer 108 for absorbing incident infrared radiation. For example, the infrared detector may be an infrared photodetector comprising an absorbing (semiconductor) layer 108 of mercury cadmium telluride (HgCdTe, MCT). The mercury cadmium telluride is advantageous in view of infrared detection as it has a tunable bandgap spanning the shortwave infrared to the very long wave infrared regions. Specifically, the tuning of the bandgap is achieved by changing the mixing ratio between CdTe (being a semiconductor with a bandgap of approx. 1.5 electronvolts at room temperature) and HgTe (being a semimetal meaning that the bandgap energy is zero). To emphasize this feature, mercury cadmium telluride may be written as $Hg_{1-x}Cd_xTe$, where x is the cadmium molar fraction. In practical infrared detector scenarios, the cadmium molar fraction may have, for example, a value of 0.2.

In other embodiments, the absorbing layer 108 of the infrared photodetector may be made of other suitable semiconductor material such as mercury zinc telluride (HgZnTe, MZT), cadmium zinc telluride (CdZnTe, CZT), lead(II) sulfide (PbS), lead selenide (PbSe), silicon (Si), gallium indium arsenide (GaInAs), indium arsenide (InAs) or indium antimonide (InSb). In some embodiments, the semiconductor material used may be an organic semiconductor material. In other embodiments, the infrared detector may be a quantum well or a quantum dot infrared photodetector (QWIP or QDIP). In such embodiments, the absorbing layer 108 of the infrared detector may be made, for example, of a perovskite. The choice of the semiconductor material depends on which infrared frequency range the infrared detector is to be used. For example, HgZnTe may provide a spectral range of 6-14 μm (or even 3-14 μm) while PbS and PbSe may be employed at lower wavelengths (approx. 1-3.3 μm and 1-4.7 μm, respectively). In some embodiments, the infrared detector 103 may be (cryogenically) cooled during the operation of the infrared detector 103 to reduce noise due to thermally excited current carriers.

In addition to the absorbing (semiconductor) layer 108, the infrared detector 103 may comprise circuitry 109 (or specifically one or more external readout integrated circuits, ROIC) for acquiring a readout of infrared radiation absorbed in the absorbing layer 108. The infrared detection may be considered to occur when an infrared photon of sufficient energy kicks an electron from the valence band to the conduction band and said electron is subsequently collected by the one or more ROICs 109 and transformed into an electric signal. The ROIC 109 may be connected to the absorbing semiconductor layer 108, for example, via indium interconnects (i.e., indium bumps) or other mature interconnect technique (not shown in FIGS. 1A, 1B and 1C). The one or more ROICs 109 may be arranged under the absorbing layer 108 of the infrared detector 103. The indium or other interconnects may be arranged between the one or more ROICs and the absorbing layer 108.

In other embodiments, the circuitry 109 and other possible elements for detecting the infrared radiation absorbed in the absorbing layer 108 such as indium interconnects may be omitted. In such embodiments, the structure illustrated in FIGS. 1A, 1B and 1C may correspond to an infrared absorber arrangement, instead of an infrared detector arrangement. The following discussion on the plasmonic layer 102 and one or more layers arranged between the plasmonic and absorbing layers 102, 108 applies equally for infrared absorber and detector arrangements.

For facilitating the following discussion, the surface 107 of the absorbing layer facing the plasmonic layer 102 and via which the incident infrared radiation is received for absorption is called a receiving surface. The absorbing layer 108 may extend along the receiving surface 107. The receiving surface 107 may be a planar surface, as illustrated in FIGS. 1A, 1B and 1C.

In some embodiments, one or more layers (not shown in FIGS. 1A, 1B and 1C) may separate said receiving surface 107 of the absorbing layer 108 from the plasmonic layer 102 (i.e., from the plurality of mushroom-shaped plasmonic elements 104). Said one or more layers may be included, for example, to improve performance or due to limitations of the manufacturing processes. Preferably, the combined thickness of said one or more layers is relatively small (compared to the operating wavelengths), for example, below 200 nm. In other words, the distance between the receiving surface 107 of the absorbing layer 108 and the plasmonic layer 102 is preferably smaller than 200 nm. In these embodiments, the plasmonic layer 102 is preferably arranged on the one or more layers (that is, in contact with one of the one or more layers which may be arranged against each other).

Said one or more layers may comprise a passivation layer (not shown in FIGS. 1A, 1B and 1C). The passivation layer (which may be equally called a non-conducting layer) may be made of dielectric and/or non-conductive material such as $SiO_2$, $Al_2O_3$, $Si_3N_4$ or CdTe. The passivation layer may be arranged on (or against) the absorbing layer 108 (that is, on or against the receiving surface 107 of the absorbing layer 108. The passivation layer may cover a whole surface of the absorbing layer 108 (that is, not just covering it at locations of the plurality of mushroom-shaped plasmonic elements 104). The passivation layer may be very thin (compared to the operating wavelengths), for example, between 30-60 nm. The passivation layer serves to prevent the creation of so-called deep states on the receiving surface 107 of the absorbing layer 108 (i.e., to passivate the deep states). The charge carriers which are trapped to a deep state cannot be utilized for infrared detection causing decrease in the performance of the detector 103.

Said one or more layers may comprise an adhesion or adhesive layer (e.g., TiW or Cr layer) arranged on or against the receiving surface 107 of the absorbing layer 108 or the passivation layer if one exists at least at locations of the plurality of sub-wavelength plasmonic elements 104 and a conductive layer (e.g., a copper, gold, nickel or silver layer) arranged on the adhesion layer and in contact with each bottom section of the plurality of sub-wavelength plasmonic elements 104. In other words, the conductive layer is arranged against the adhesion layer on one side and each bottom section of the plurality of sub-wavelength plasmonic elements 104 on an opposite side. The conductive layer may be a seed layer (for electroplating). The properties of the adhesion layer and the seed layer (i.e., the conductive layer) are discussed in more detail in relation to FIGS. 3 and 4.

Figure 2A:
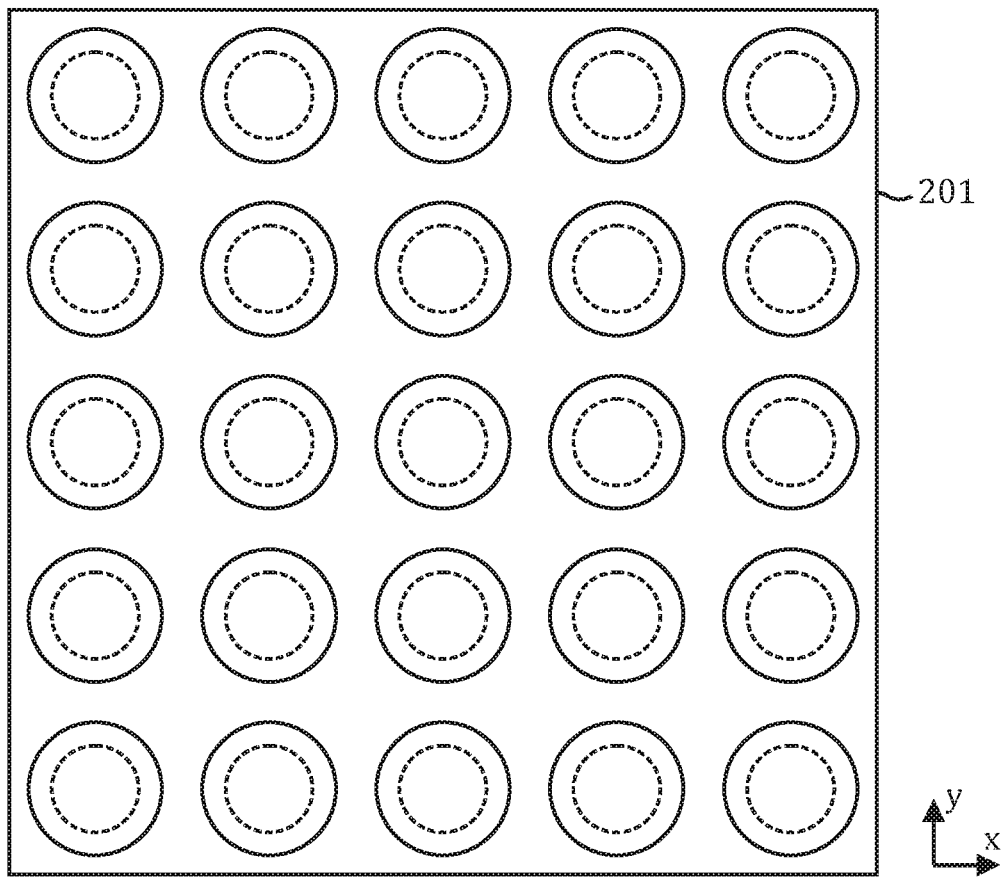
FIGS. 2A and 2B illustrate two exemplary arrangements according to embodiments.
Figure 2B:
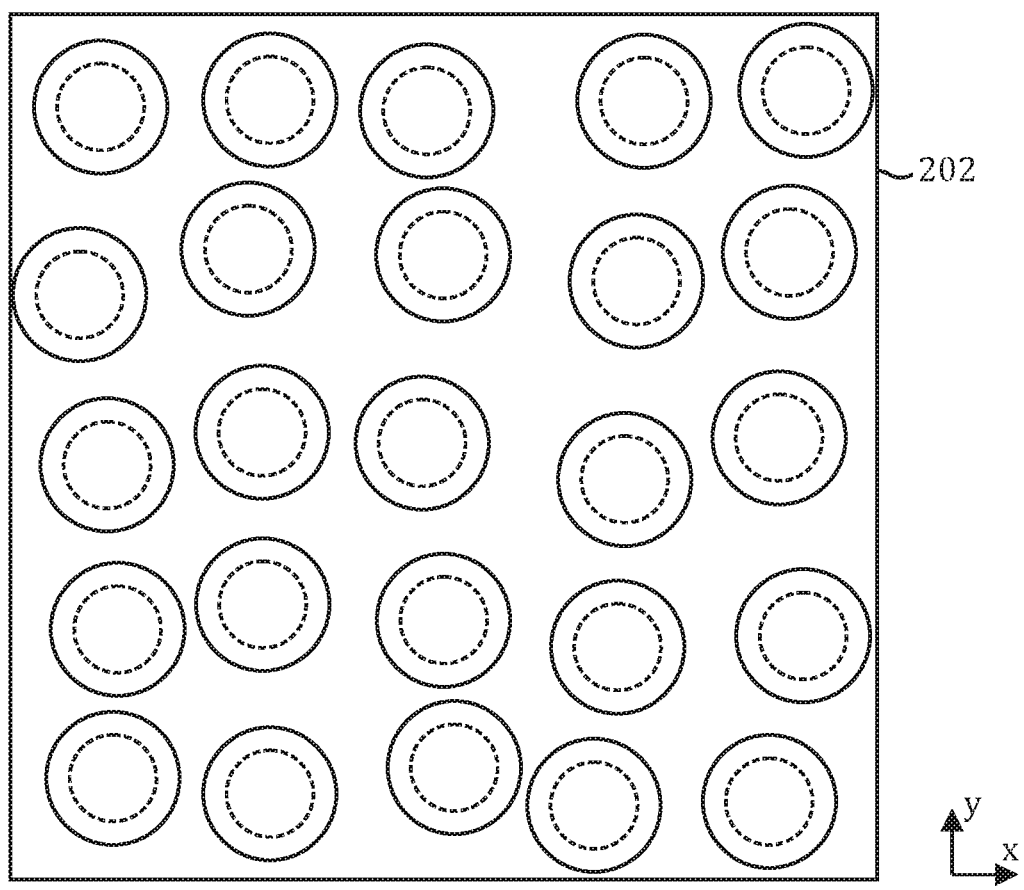
Figure 3:
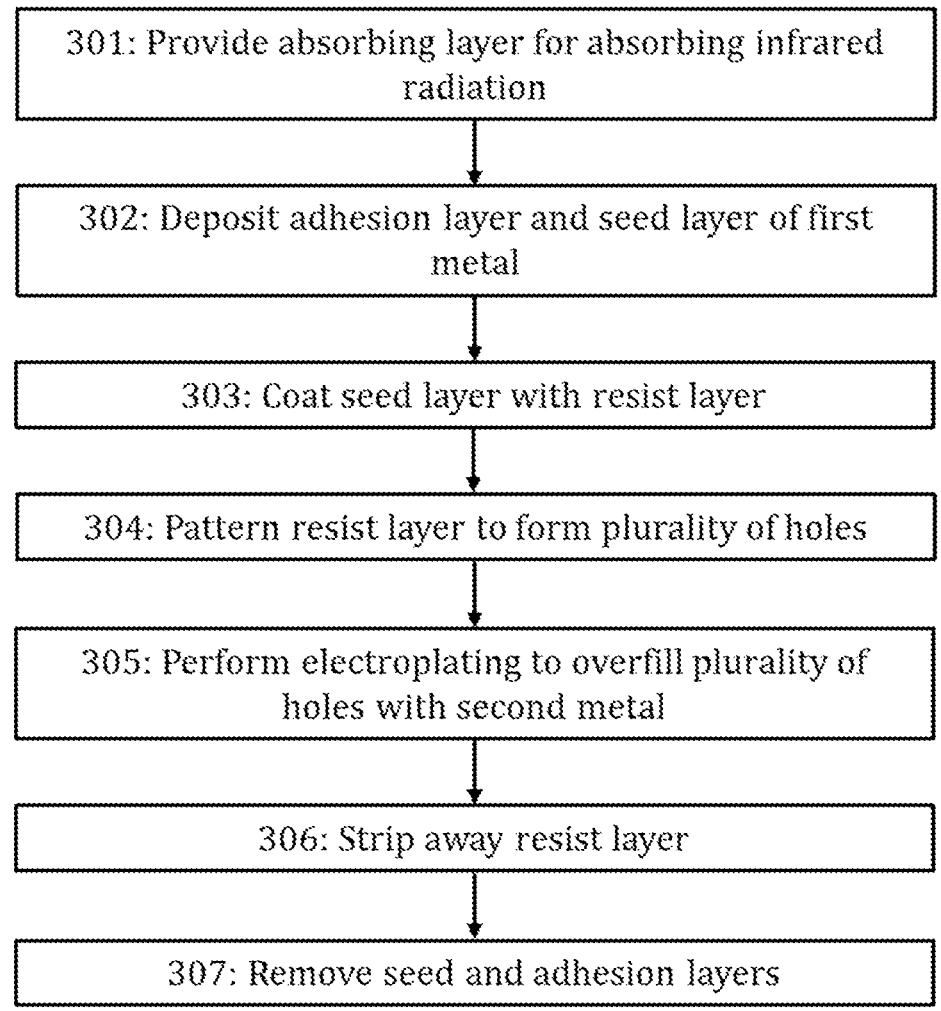
FIGS. 3 and 4 illustrate a process of manufacturing an infrared detector arrangement according to embodiments.
Figure 4:
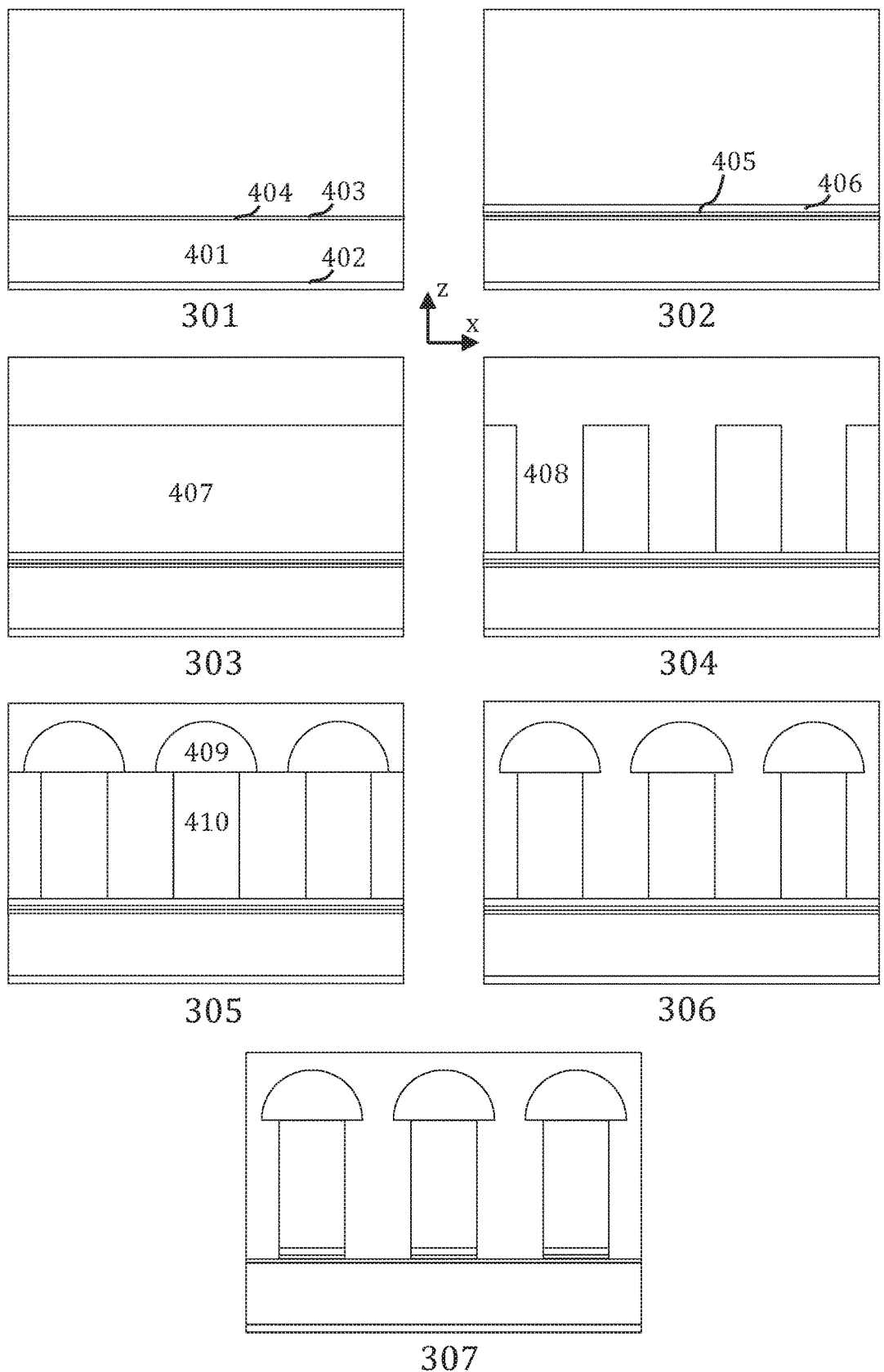

An infrared detector or absorber arrangement according to an exemplary embodiment comprising all three of the passivation layer, the adhesion layer and the seed layer is illustrated in FIG. 4 (or specifically in the bottom subfigure corresponding to the final method step of 307 of FIG. 3, that is, corresponding to the end result of the exemplary manufacturing process of FIG. 3). FIGS. 3 and 4 are to be discussed in detail following the discussion on FIGS. 1A, 1B, 1C, 2A and 2B.

The embodiments aim to enhance the coupling of the infrared radiation to the absorbing layer 108 using the plasmonic layer 102 (that is, using a plurality of plasmonic elements). Said enhancement is based on the use of so-called plasmon resonances. Under certain conditions, an interface between a dielectric (with a positive permittivity) and a material with negative permittivity (e.g., silver or gold in the optical frequencies) supports electromagnetic surface wave modes, that is, electromagnetic waves confined to the interface, propagating in a direction parallel to the negative permittivity/dielectric material interface and evanescent (i.e., exponentially decaying) in both directions orthogonal to said interface. Such surface wave modes are called propagating surface plasmon polaritons (SPPs). However, the problem with the use of plasmonic enhancement in the infrared frequency range based on propagating SPPs is that the plasma (resonance) frequency above which the real part of the dielectric function becomes positive and a given metal starts to behave like a dielectric is in the ultraviolet or visible part of the spectrum. The surface plasmon frequency at which an ideal surface plasmon is generated (and at which the concentration of the electromagnetic wave is thus maximized) is directly proportional to the plasma frequency. In other words, the surface plasmons may only occur close the surface plasmon frequency which, in the case of most dielectric-metal interfaces, is in the ultraviolet or visible part of the spectrum (due to the plasma frequency being in the ultraviolet or visible part of the spectrum). Therefore, while metals such as gold, silver and copper may be used without modification in the optical frequencies for generating surface plasmon polaritons, in infrared frequencies it is necessary to redshift the (effective) plasma frequency (and thus also the surface plasmon frequencies) towards longer operating wavelengths.

One strategy for achieving said redshifting is to form patterns of subwavelength plasmonic (conductive) elements (or (nano)particles) of a certain designed shape on or close to the receiving surface 107 of the absorbing layer 108 receiving surface. Said elements, which may be, e.g., metallic, may act as (nano)aperture arrays supporting the existence of so-called localized (designer) surface plasmon polaritons. The excitation of said localized surface plasmon polaritons results from the confinement of a surface plasmon in a sub-wavelength element or particle. Due the localized surface plasmon polaritons, the electric fields near the surface of the sub-wavelength plasmonic element are greatly enhanced. The absorption and scattering of the sub-wavelength plasmonic element have a maximum at a (localized) surface plasmon resonance frequency which may be tuned by changing the geometry, dimensions and the dielectric environment surrounding the sub-wavelength plasmonic elements. When excited, each sub-wavelength plasmonic element may act similar to a dipole or may exhibit multiple resonance modes, depending on the geometry and dimensions of the sub-wavelength plasmonic elements. The embodiments provide one such solution employing a particular advantageous mushroom-like geometry for achieving (localized) surface plasmon resonances at the infrared frequency range to be discussed in the following.

The plasmonic (metamaterial) layer 102 is arranged above the absorbing layer 108 for enhancing absorption of the incident infrared radiation into the absorbing layer 108 (via the receiving surface 107 of the absorbing layer 108). The plasmonic (metamaterial) layer 102 may be in contact with the receiving surface 107 or it may be separated from it by the aforementioned one or more layers, to be discussed in further detail in relation to further embodiments. The plasmonic layer 102 as a whole may comprise a plurality of mushroom-shaped plasmonic elements 104 having sub-wavelength dimensions and sub-wavelength spacings (i.e., sub-wavelength spacings between adjacent elements) and arranged along the receiving surface 107 (i.e., along the xy-plane in FIGS. 1A, 1B and 1C). Each of said plurality of mushroom-shaped plasmonic elements 104 may project out relative to the receiving surface 107. The plurality of mushroom-shaped plasmonic elements 104 may be arranged in a regular or irregular sub-wavelength lattice. Preferably, the plurality of mushroom-shaped plasmonic elements 104 are identical to each other. As mentioned above, in this example a periodic or regular lattice (specifically, a square lattice) is used and since FIGS. 1A, 1B and 1C illustrate only a single unit cell, only a single sub-wavelength plasmonic element 104 is illustrated.

The term "sub-wavelength" is to be understood here and in the following to mean smaller than the free-space wavelength at a central operating infrared frequency of the infrared detector or absorber arrangement. Thus, the spacing between each element and its closest neighboring element as well as the size of the element itself (i.e., each dimension of the element) should be at least smaller than the free-space wavelength at a central operating infrared frequency of the infrared detector or absorber arrangement (preferably even smaller than that as will be discussed in the following). The central operating infrared frequency of the infrared detector or absorber arrangement may be dependent, for example, on the choice and design (e.g., in terms of cadmium or other molar fraction) of semiconductor material in the absorbing layer 108, the geometry and dimensions of the mushroom-shaped plasmonic elements 104 and the material of the mushroom-shaped plasmonic elements 104. The central operating infrared wavelength may, at least in principle, have a value anywhere in the infrared range, that is, between 0.7 μm and 1000 μm. In most practical scenarios, the central operating infrared wavelength has a value between 1 μm and 14 μm.

Each sub-wavelength element 104 forming the plasmonic layer 102 extends along a longitudinal direction orthogonal to the receiving surface (i.e., along the z-direction in the illustrated example) and comprises two longitudinal sections 105, 106 connected to each other (i.e., in contact with each other). Specifically, said two longitudinal sections are a bottom section 106 facing the receiving surface 107 and a top section 105 facing away from the receiving surface 107. In other words, the top section 105 (i.e., "a cap of a mushroom") is arranged farther from the receiving surface 107 (and thus from the absorbing layer 108) than the bottom section 106 (i.e., "a stem of a mushroom"). The bottom section has a first width 110 along a plane defined by the receiving surface 107 (i.e., along the xy-plane in the illustrated example) and the top section 105 has a second width 111 along the plane defined by the receiving surface larger than the first width. The first and second width may specifically correspond to the maximal width on the plane defined by the receiving surface. For example, if the bottom section has the shape of a right cuboid or a right elliptical cylinder, the first width may be the diagonal length of the base of the right cuboid (i.e., not the length of a side of the cuboid) or a length of the major axis of elliptical base of the right elliptical cylinder, respectively. In other embodiments, the first width may be the width along a particular direction on said plane. The top section 105 is preferably shorter than the bottom section 106 (i.e., shorter along the longitudinal direction).

In the illustrated example, the top section 105 has the shape of a hemisphere and the bottom section 106 has the shape of a cylinder. In this case, said first width is a (first) diameter of said cylinder 106 and said second width is a (second) diameter of said hemisphere, as illustrated in FIG. 1C with arrows 110, 111 respectively. However, the embodiments are not limited to these particular shapes for the top and bottom sections 105, 106.

In general, the bottom section 106 may have a constant cross-sectional area (defined on the xy-plane), as also illustrated in FIGS. 1A, 1B and 1C. In some embodiments, each bottom section 106 has a shape of one of a right circular cylinder, a right elliptical cylinder and a right prism, where both bases of each bottom section may be orthogonal to the longitudinal direction (i.e., z-direction in FIGS. 1A, 1B and 1C). A prism is a polyhedron comprising an n-sided polygonal base, a second base which is a translated copy (rigidly moved without rotation) of the first, and n other faces (necessarily all parallelograms) joining corresponding sides of the two bases, where n is an integer and all cross-sections parallel to the bases are translations of the bases.

In general, the top section 105 may have a constant cross-sectional area (defined on the xy-plane) or a cross-sectional area (defined on the xy-plane) which decreases when moving away from the bottom section 106 (that is, which decreases along the +z-direction), as illustrated in FIGS. 1A, 1B and 1C. In the latter case, the top section 105 may be rounded (as in the case of the hemisphere 105 of FIGS. 1A, 1B and 1C) or have a sharp tip. Preferably, the top section 105 (or specifically the bottom of the top section) covers a larger area (along the receiving surface 107 or the xy-plane) compared to a corresponding bottom section 106. In some embodiments, each top section 105 has a shape of one of a right cylinder, a right elliptical cylinder, a right prism, a spherical cap, a hemisphere, an ellipsoidal cap, a regular right pyramid and a regular right frustum. A base of each top section 105 (having any of said shapes) may be orthogonal to the longitudinal direction and in contact with a corresponding bottom section 106. According to an alternative definition, a base of each top section 105 may be parallel to the receiving surface 107 (or specifically parallel to a plane defined by the receiving surface 107 at a location of a corresponding sub-wavelength element 104 if the receiving surface 107 is not planar) and be in contact with a corresponding bottom section.

In some embodiments, both the top section 105 and the bottom section 106 are rotationally symmetric with respect to the longitudinal direction (i.e., z-direction). The top section 105 and/or the bottom section 106 may specifically possess n-fold rotational symmetry, where n is any integer larger than one (e.g., 2, 3, 4, 5 or 6).

In some embodiments, the top section 105 and the bottom section 106 may be coaxial. In some embodiments, a base (or a bottom base if multiple bases exists) of the top section 105 may be concentric with at least a top base of the bottom section 106 (as, e.g., in FIGS. 1A, 1B and 1C). The base (or the bottom base if multiple bases exists) of the top section 105 may have the same shape (e.g., a circle or a polygon of the same type) as the top base of the bottom section 106 (as, e.g., in FIGS. 1A, 1B and 1C).

As mentioned above, each mushroom-shaped plasmonic element 104 should be at least smaller than the free-space wavelength at a central operating infrared frequency. However, stricter requirements for the size of the mushroom-shaped plasmonic elements 104 may be defined to ensure good performance. In the following definitions, $\lambda_c$ is used to denote a free-space wavelength at a central operating infrared frequency of the infrared detector or absorber arrangement. Said definitions may be applicable to any of the aforementioned shapes of the top and bottom sections 105, 106.

In some embodiments, the first width of each bottom section 106 may have a value between $0.05\lambda_c$ and $0.25\lambda_c$ (preferably between $0.07\lambda_c$ and $0.13\lambda_c$).

In some embodiments, the second width may have a value between $1.1w_1$ and $2w_1$, where $w_1$ is the first width.

In some embodiments, each of the plurality of the mushroom-shaped plasmonic elements 104 may have a height (that is, a total height of both top and bottom sections 105, 106) along the longitudinal direction between $0.1\lambda_c$ and $0.5\lambda_c$, preferably between $0.15\lambda_c$ and $0.35\lambda_c$.

In some embodiments, a ratio of a height of each bottom section 106 of the plurality of the mushroom-shaped plasmonic elements 104 to a height of each top section 105 of the plurality of the mushroom-shaped plasmonic elements 104 may be larger than two, preferably larger than three.

In addition or alternatively to the above limits on the dimensions of the elements 104, limits for the area of the receiving surface 107 that the top and bottom section 105, 106 cover (i.e., the coverage) may be defined. The bottom sections 106 of the plurality of mushroom-shaped plasmonic elements 104 when projected to the receiving surface 107 along the longitudinal direction (i.e., z-direction) may cover 10% to 40%, preferably 15% to 33%, of an area of the receiving surface 107. The area of the receiving surface 107 means, here, the total area of the receiving surface 107. On the other hand, the top sections 105 of the plurality of mushroom-shaped plasmonic elements 104 when projected to the receiving surface 107 along the longitudinal direction may cover 20% to 60%, preferably 24% to 55%, of an area of the receiving surface 107. Moreover, the top sections 105 of the plurality of mushroom-shaped plasmonic elements 104 should, preferably, cover a larger area of the receiving surface 107 than the corresponding bottom sections 106.

Each mushroom-shaped plasmonic element 104 (or specifically each of the top section 105 and/or the bottom section 106 of each mushroom-shape plasmonic element 104) may be made of a metal or a heavily doped semiconductor and/or have a metallized or highly conductive outer surface. Specifically, each mushroom-shaped plasmonic element 104 (or specifically each of the top section 105 and the bottom section 106 of each sub-wavelength plasmonic element 104) may be made of copper, nickel, gold, silver, aluminium-doped zinc oxide and/or doped silicon. It is well known that heavily doped semiconductors may exhibit metal-like behavior, especially when cooled. However, compared to metals they provide the benefit that their properties (e.g., concentration of charge carriers and mobility) may be tuned by changing the amount of doping. Any of the aforementioned metals may, alternatively, be used for metallizing the outer surface of each mushroom-shaped plasmonic element (or a section thereof). If the mushroom-shaped plasmonic elements 104 are metallized, the choice of the (core) material for the element which metallized is of minor importance. For example, a conventional dielectric (with positive permittivity) may be employed.

In some embodiments, each of the top section 105 and/or the bottom section 106 of each mushroom-shaped plasmonic element 104 may be made of two or more materials in a pre-defined arrangement. For example, said pre-defined arrangement of multiple materials may comprise two or more material layers which may be, for example, of any material mentioned in the previous paragraph or some other material. Said layers may be oriented along (or at angle relative to) a plane parallel to the longitudinal direction or along (or at angle relative to) the receiving surface 107.

In some embodiments, each of the top and bottom section 105, 106 of each mushroom-shaped plasmonic element 104 may be made of the same material and/or have similar metallization. The top and bottom sections 105, 106 of each mushroom-shaped plasmonic element may have been manufactured together as a singular element. In other embodiments, the top and bottom sections 105, 106 of each mushroom-shaped plasmonic element 104 may have been manufactured separately and subsequently joined, fixed or attached together.

It should appreciated that while the different preferred dimensions and material selections of the absorbing layer 108 and the plasmonic layer 102 were discussed above separately, the best result in terms of performance (e.g., sensitivity and speed) may be achieved when the absorbing layer 108 and the plasmonic layer 102 are designed together. For example, the absorbing layer 108 and the plasmonic layer 102 may be jointly optimized numerically, e.g., using a (commercial) electromagnetic simulation software, and/or analytically. The absorption enhancement achieved with the embodiments discussed above is predominantly based on three phenomena. Firstly, the plasmonic layer 102 comprising a plurality of mushroom-shaped plasmonic elements 104 causes scattering of the incident infrared radiation in favorable angles so as to lengthen the optical path of the infrared radiation (i.e., photons) in the absorbing layer 108. Secondly, the plasmonic layer 102 enhances the electromagnetic near-field near the mushroom-shaped plasmonic elements 104 in the absorbing layer 108. Thirdly, the plasmonic layer creates a broadband antireflection surface and thus minimizes the reflections from the absorbing layer 108. Due to the enhanced absorption, the volume of the absorbing layer 108 may be decreased without loss of sensitivity. In the case of an infrared detector 103 comprising said absorbing layer 108, the speed of the infrared detection may, thus, also be increased and noise reduced. Further, the enhanced sensitivity and lower noise enables operation at higher temperatures (less cooling) without compromising the signal/noise ratio. Said three phenomena are especially pronounced when the sub-wavelength plasmonic elements have the mushroom-like shape as discussed above and illustrated in FIGS. 1A, 1B and 1C. The advantageous nature of the chosen geometry will be demonstrated in relation to FIG. 5.

FIGS. 2A and 2B illustrate two simplistic examples of infrared detector arrangements (or equally of infrared absorber arrangements), each comprising 25 mushroom-shaped plasmonic elements having sub-wavelength dimensions and spacings. Specifically, FIGS. 2A and 2B show views of two infrared detector or absorber arrangements from "above" (i.e., a view of the xy-plane), similar to FIG. 1C. While the mushroom-shaped plasmonic elements may in both cases correspond, for example, to the plasmonic element 104 of FIGS. 1A, 1B and 1C, FIGS. 2A and 2B illustrate two different ways of arranging said elements along the receiving surface of the absorbing layer.

The infrared detector or absorber arrangement 201 of FIG. 2A corresponds to the unit cell illustrated in FIGS. 1A, 1B and 1C. Therefore, the sub-wavelength lattice according to which the mushroom-shaped plasmonic elements are organized is a square lattice. In such a case, the spacing between neighboring mushroom-shaped plasmonic elements is constant for all elements. The square lattice is one example of a regular lattice. Other regular lattices may be employed in other embodiments. Other regular lattices according to embodiments may comprise, for example, a rectangular lattice, a triangular lattice and a hexagonal lattice. The sub-wavelength lattice may be any polygonal lattice.

In FIG. 2B, the 25 mushroom-shaped plasmonic elements in the infrared detector or absorber arrangement 202 are organized (or arranged) along the receiving surface in an irregular or random lattice. In such a case, the spacing between neighboring mushroom-shaped plasmonic elements may vary in a random manner. It should be noted that even in the case of FIG. 2B the arrangement of the mushroom-shaped plasmonic elements may not be considered fully random as obviously overlapping or touching of elements is not allowed. A random or irregular lattice should be understood here as a lattice with at least some degree of randomness. The randomness or irregularity of the lattice may be a design choice or it may result from a limitation of a particular manufacturing process.

The definitions provided in relation to FIGS. 1A, 1B and 1C (pertaining to, e.g., dimensions of the elements and/or their coverage) may be applied for any of the aforementioned lattices according to embodiments.

FIG. 3 illustrates a process of manufacturing an infrared detector arrangement according to embodiments as a flowchart. The product of the manufacturing process may correspond to the infrared detector arrangement as described in relation to any of FIGS. 1A, 1B, 1C, 2A and 2B. FIG. 4 illustrates a non-limiting example of how said process of manufacturing the infrared detector arrangement is carried out. Specifically, FIG. 4 illustrates each step of the manufacturing process of FIG. 3 using a side view of a small section of the infrared detector arrangement (or what is eventually to be the infrared detector arrangement), similar to FIG. 1B albeit showing three unit cells instead of a single unit cell. Each subfigure of FIG. 4 illustrates a state of the infrared detector arrangement after a corresponding step of the process of FIG. 3 has been completed. It should be noted that FIG. 4 illustrates a cut plane similar to FIG. 1B even though the line pattern indicating a cut has been left out from FIG. 4 for clarity. In the following, FIGS. 3 and 4 are discussed jointly.

Initially in step 301, there is provided an absorbing (semiconductor) layer 401 for absorbing incident infrared radiation. In this embodiment, the absorbing layer is specifically an absorbing layer of an infrared (photo)detector. As illustrated in FIG. 4, the infrared detector may further comprise one or more external readout integrated circuits (ROIC) 402 for acquiring a readout of the absorbed infrared radiation. Also, a non-conducting or passivation layer 403 (later just passivation layer for brevity) may be arranged on or against the absorbing layer 401 or specifically a receiving surface 404 of the absorbing layer 401 (as defined also in relation to FIGS. 1A, 1B and 1C). As described above, the passivation layer 403 may be a very thin layer (compared to the operating infrared wavelengths), for example, between 30-60 nm, made of dielectric and/or non-conductive material such as $SiO_2$, $Al_2O_3$, $Si_3N_4$ or CdTe and serves to prevent the creation of so-called deep states. In general, the illustrated infrared detector may correspond to the infrared detector 103 as described in relation to FIGS. 1A, 1B and 1C.

In step 302, an adhesion layer 405 is deposited on (or over) a receiving surface 404 of the absorbing layer 401 and further a seed layer 406 of a first metal (i.e., a conductive layer) is deposited on the adhesion layer 405. If a passivation layer 403 exists (as shown in FIG. 4), the depositing of the adhesion layer 405 is performed on the passivation layer 403 (otherwise, it is performed directly on the receiving surface 404 of the absorbing layer 401). Preferably, the seed layer 406 should be deposited immediately following the deposition of the adhesion layer 405 in the same vacuum chamber. As the name implies, the adhesion layer 405 acts to improve adhesion of the seed layer 406 to the absorbing layer. As the volume properties of the adhesion layer 405 (as opposed to surface properties) are of little interest, the thicknesses of the adhesion layer 405 may also be very small compared to the (operating) infrared wavelengths and possibly also compared to the mushroom-shaped plasmonic elements to be manufactured. For example, the adhesion layer 405 may have a thickness between 1-10 nanometers or even 1-5 nm (e.g., 4 nm). Ideally, the adhesion layer 405 should be thin enough so as not to have significant effect on the absorption enhancement. The adhesion layer 405 may be made of, for example, titanium tungsten (TiW) or chromium (Cr). The seed layer 406 is used for providing an optimum nucleations rate for growth in the later process. The seed layer 406 may be made of, for example, copper, gold, nickel or silver. The seed layer 406 may be, similar to the adhesion layer 405, thin compared to the infrared wavelengths, but possibly significantly thicker than the adhesion layer 405, for example, having a thickness in the range of 100-300 nm. The first metal of the seed layer 406 may be, for example, copper, nickel, gold or silver.

In step 303, the seed layer 406 is coated with a resist layer 407 (e.g., using spin or spray coating). The resist layer 407 may be a photoresist layer or an electron beam resist layer, that is, a layer of a sensitive material which degrades when exposed to light or an electron beam. The photoresist used in the resist layer 407 may be any known positive or negative photoresist such as any epoxy-based polymer. The electron beam resist used in the resist layer 407 may be any known electron beam resist such as a ZEP-250 resist or a PMMA resist. The resist layer 407 may have a thickness as described for the length of the bottom sections in relation to FIGS. 1A, 1B and 1C. For example, the resist layer 407 may have a thickness of approx. 2 µm.

In step 304, the resist layer 407 is patterned to form a plurality of sub-wavelength holes 408 arranged in a sub-wavelength lattice. Specifically, if the resist layer 407 is a photoresist layer, ultraviolet lithography (equally called photolithography) may be used for the patterning and if the resist layer 407 is an electron beam resist layer, electron beam lithography may be used for the patterning. The plurality of sub-wavelength holes 408 may extend along a longitudinal direction orthogonal to the receiving surface 404 (i.e., along z-direction) through the whole resist layer 407, as illustrated in FIG. 4. The plurality of sub-wavelength holes 408 may be arranged along the receiving surface 404 in a periodic lattice or an irregular lattice, similar to as described in relation to arrangement of the mushroom-shaped plasmonic element in connection with FIGS. 2A and 2B. The cross section of each hole (along the receiving surface 404) may be, for example, circular, elliptical or polygonal.

As mentioned above, electron-beam or ultraviolet (UV) lithography may be used in the patterning of electron beam resist or photoresist layer 407, respectively. In electron-beam lithography, a focused beam of electrons is scanned to draw custom shapes (here, a plurality of holes 408 arranged according to a sub-wavelength lattice) on a surface covered with an electron beam resist. The electron beam changes the solubility of the resist, enabling selective removal of either the exposed or non-exposed regions of the resist by immersing it in a developer. In UV lithography, UV light is used to transfer a custom shape from a photomask (i.e., an opaque plate with holes or transparencies allowing light to shine through in a defined pattern) to the photoresist. Similar to the electron-beam lithography, either the exposed or non-exposed regions of the photoresist may be removed by immersing the photoresist in a developer. Thus, both techniques, thus, provide the same or similar end result.

In step 305, electroplating is performed to fill the plurality of holes 408 in the resist layer 407 with a second metal. In other words, the parts of the seed layer 406 which were exposed during the patterning are plated with the second metal. Specifically, the electroplating is carried out so that the plurality of holes 408 are overfilled so as to form, for each bottom section 410 filling a hole, a top section 409 extruding from said hole and having a larger width (or diameter) than said hole. The diameter or width is defined here as the diameter or (maximal) width along a plane defined by the receiving surface 404, similar to the definition of the first and second widths in relation to FIGS. 1A, 1B and 1C.

In electroplating, an electric current is used to reduce dissolved metal cations so that they form a thin coherent metal coating on an electrode (i.e., on the seed layer 406 in this case). The electroplating may be carried out by, first, placing the structure illustrated in FIG. 4 as element 304 in an electrolyte bath with a piece of the second metal. The seed layer (i.e., the part to be plated) is used as a cathode of an electric circuit providing an electric current (e.g., using a battery or another power source) and the piece of the second metal is used as an anode of said electric circuit. The flow of electric current through the electric circuit (i.e., through the electrolyte) results in effective transfer of the second metal from the anode to the cathode.

The second metal used for the electroplating may be a different metal from the first metal or the same metal as the first metal. For example, the second metal may be copper, nickel, gold or silver. The resulting metallic object (or a plurality of metal objects) may have a mushroom-like shape as illustrated previously in FIGS. 1A, 1B and 1C.

In some embodiments, the electroplating may be carried out in two parts so that the electroplating is carried out, first, using the second metal (e.g., nickel) until a pre-defined electroplating result is achieved, for example, until the plurality of bottom sections 410 filling the plurality of holes 408 are formed. Then, the electroplating may be completed using a third metal (a different metal from the second metal), for example, so as to form the plurality of top sections 409. The third metal may be, for example, copper, nickel, gold or silver.

In step 306, the resist layer 407 (or what remains of the resist layer 407 after the patterning) is stripped away. Any known resist stripping technique may be employed. For example, resist stripping technique used may be an organic stripping technique, an inorganic stripping technique or a dry stripping technique.

In step 307, the adhesion layer 405 and the seed layer 406 are removed. The removal may be carried out, for example, using wet or dry etching. Specifically, the adhesion layer 405 and the seed layer 406 may be removed at locations along the receiving surface 404 not supporting the plurality of mushroom-shaped plasmonic elements created by electroplating in step 305. In some embodiments (e.g., where the adhesion layer 405 is very thin such as smaller than 2 nm), only the seed layer 406 may be removed.

As mentioned above, the product of the manufacturing process discussed in relation to FIGS. 3 and 4 may correspond to the infrared detector arrangement as described in relation to any of FIGS. 1A, 1B, 1C, 2A and 2B. To this end, any of the process steps 301 to 307 may be tuned or modified so as to achieve mushroom-shaped plasmonic elements having any of the shapes, dimensions and materials as described in relation to FIGS. 1A, 1B, 1C, 2A and 2B.

While the manufacturing process illustrated in FIGS. 3 and 4 was discussed above in terms of an infrared detector arrangement, it is obvious that similar process applies also for an infrared absorber arrangement according to embodiments (as discussed in relation to FIGS. 1A, 1B and 1C). In such embodiments of the process, the only difference to what was described above in relation to FIGS. 3 and 4 for the infrared detector arrangement is that there is initially provided, in block 301, a separate absorbing layer 401, that is, an absorbing layer which is not a part of any infrared detector which may comprise further elements such as ROIC 402. In terms of FIG. 4, only the element 402 is omitted.

Figure 5:
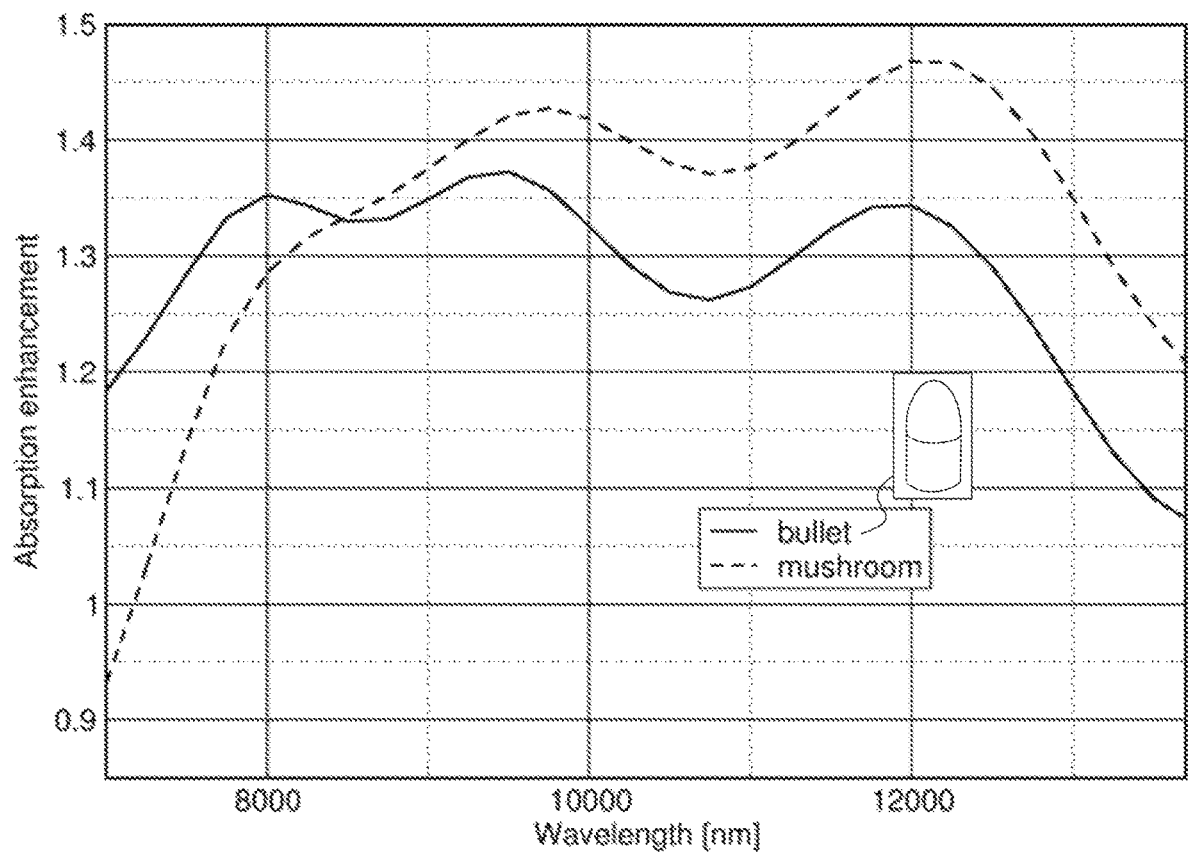
FIG. 5 illustrates absorption enhancement achieved with an exemplary infrared absorber arrangement according to embodiments compared to a reference infrared absorber arrangement.

FIG. 5 illustrates the absorption enhancement achieved with a plasmonic layer comprising a plurality of mushroom-shaped sub-wavelength plasmonic elements according to embodiments as a function of wavelength. Specifically, the geometry of the studied mushroom-like element is the same as the one illustrated in FIGS. 1A, 1B, 1C, 2A, 2B and 4 (that is, consisting of a cylindrical bottom section and a hemispherical top section). The absorption enhancement describes enhancement in the absorption compared to the absorbing layer without the sub-wavelength plasmonic elements. In the illustrated example, the mushroom-shaped sub-wavelength plasmonic elements are made of copper, have the height of 2500 nm, bottom diameter (i.e., the first width) of 1200 nm, top diameter (i.e., the second width) of 1560 nm, and are arranged periodically with a period of 2200 nm. The mushroom-shaped plasmonic elements are compared to a bullet-shaped sub-wavelength plasmonic element (shown in an inset of FIG. 5) having the same height and bottom diameter, being of the same material and arranged periodically with a period very close (practically equivalent) to that used for the mushroom-like element (specifically, a period of 2100 nm). In both cases, the absorbing layer is the same and the adhesion layer is made of chromium with a thickness of 4 nm. The illustrated results are based on full-wave electromagnetic simulations of infinitely periodic cascades of sub-wavelength plasmonic elements above a similarly infinitely periodic absorbing layer.

Referring to FIG. 5, while both the mushroom design of the sub-wavelength plasmonic element and the bullet design of the sub-wavelength plasmonic element provide absorption enhancement over the bare absorbing layer, the mushroom design provides an improvement also over the bullet design at least in the range of 8220 nm to 12830 nm (the latter value being the end of the simulated wavelength range). The improvement is especially pronounced around 12000 nm, where the mushroom design provides an absorption enhancement of 1.47 while the bullet design provides an absorption enhancement of only 1.29. It should be noted that even better results may be achievable via further optimization of the geometry and dimensions of the mushroom-shaped sub-wavelength plasmonic element.

The embodiments described above may provide a promising practical tool for the designers of future IR detectors with enhanced functionalities (also in the pixel level) by improving the absorption, and thus the photoresponsivity of a detector. Properly designed plasmonic structures provide a means to decrease the volume of a detector/pixel and, thus, to reduce the noise levels and enhance the signal-to-noise ratio and speed. In addition, spectral engineering and polarity selection may be realized. The suggested methods also provide high potential for cost reduction in high-performance IR imaging systems by enabling less cooling and smaller size pixels. In the future, localized surface plasmon based performance enhancement may be introduced into a standard commercial IR detector or imaging camera. Improved of the performance of the infrared detector may be achieved by introducing minor additional fabrication steps compatible with silicon fabrication processes, as described in relation to FIGS. 3 and 4. The proposed fabrication method enables production of tall and unconventional shapes (such as the mushroom shape). Inclusion of application-specific plasmonic designs in the fabrication processes of infrared detectors is a promising path towards realizing high-end IR detector systems with excellent performance, reasonable price and convenient operation (less cooling) as well for improving the thermal resolution of lower-end detectors.

Even though the invention has been described above with reference to examples according to the accompanying drawings, it is clear that the invention is not restricted thereto but it can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways.

The invention claimed is:

1. A structure comprising:
    an absorbing layer for absorbing incident infrared radiation received via a receiving surface of the absorbing layer; and
    a plurality of mushroom-shaped plasmonic elements for enhancing absorption of the incident infrared radiation into the absorbing layer, wherein said plurality of mushroom-shaped plasmonic elements have sub-wavelength dimensions and sub-wavelength spacings and are arranged along the receiving surface, each of said plurality of mushroom-shaped plasmonic elements projecting out relative to the receiving surface.

2. The structure of claim 1, further comprising:
    a non-conducting layer arranged on the receiving surface of the absorbing layer.

3. The structure of claim 2, further comprising:
    an adhesion layer arranged on the non-conducting layer at least at locations of the plurality of mushroom-shaped plasmonic elements; and
    a conductive layer arranged on the adhesion layer and in contact with each of the plurality of mushroom-shaped plasmonic elements.

4. The structure of claim 1, wherein each mushroom-shaped plasmonic element is made of at least one metal and/or at least one heavily doped semiconductor and/or has a metallized or highly conductive outer surface.

5. The structure of claim 1, wherein each of the plurality of the mushroom-shaped plasmonic elements has a height between $0.1\lambda_c$ and $0.5\lambda_c$, preferably between $0.15\lambda_c$ and $0.35\lambda_c$, $\lambda_c$ being a central operating infrared wavelength of the structure.

6. The structure of claim 1, wherein the plurality of mushroom-shaped plasmonic elements are arranged in a sub-wavelength lattice which is a regular lattice, being preferably a square lattice, a rectangular lattice or a hexagonal lattice, or an irregular lattice.

7. The structure of claim 1, wherein the absorbing layer is made of one of mercury zinc telluride, cadmium zinc telluride, lead(II) sulfide, lead selenide, silicon, gallium indium arsenide, indium arsenide, indium antimonide and a perovskite.

8. The structure of according to any claim 1, wherein each of the plurality of mushroom-shaped plasmonic elements comprises two longitudinal sections connected to each other, said two longitudinal sections being
    a bottom section having a first width along a plane defined by the receiving surface and
    a top section having a second width along the plane defined by the receiving surface larger than the first width, the top section being arranged farther from the receiving surface than the bottom section.

9. The structure of claim 8, wherein the first width has a value between $0.05\lambda_c$ and $0.25\lambda_c$, preferably between $0.07\lambda_c$ and $0.13\lambda_c$, and/or the second width has a value between $1.1w_1$ and $2w_1$, $\lambda_c$ being a central operating infrared wavelength of the structure and $w_1$ being the first width.

10. The structure of claim 8, wherein a ratio of a height of each bottom section of the plurality of the mushroom-shaped plasmonic elements to a height of each top section of the plurality of the mushroom-shaped plasmonic elements is larger than two, preferably larger than three.

11. The structure of claim 8, wherein each bottom section has a shape of one of a right circular cylinder, a right elliptical cylinder and a right prism and/or each top section has a shape of one of a right cylinder, a right elliptical cylinder, a right prism, a spherical cap, a hemisphere, an ellipsoidal cap, a regular right pyramid and a regular right frustum, bases of each bottom section being orthogonal to a longitudinal direction and a base of each top section being orthogonal to the longitudinal direction and being in contact with a corresponding bottom section.

12. The infrared detector arrangement comprising:
    a structure of claim 1; and
    an infrared detector, wherein an absorbing layer of said structure acts as an absorbing layer of the infrared detector.

13. A method comprising:
    providing an absorbing layer for absorbing incident infrared radiation received via a receiving surface of the absorbing layer;
    depositing an adhesion layer on the receiving surface of the absorbing layer and a seed layer of a first metal on the adhesion layer;
    coating the seed layer with a resist layer;
    patterning the resist layer to form a plurality of holes having sub-wavelength dimensions and sub-wavelength spacings;
    performing electroplating on the seed layer to fill the plurality of holes with a second metal, wherein the plurality of holes are overfilled so as to form, for each bottom section filling a hole, a top section extruding from said hole and having a larger width than the hole;
    stripping the resist layer; and
    removing the adhesion layer and the seed layer using wet or dry etching.

14. The method of claim 13, wherein a non-conducting layer is arranged on the receiving surface of the provided absorbing layer, the method further comprising:
    performing the depositing of the adhesion layer on the non-conducting layer.

15. The method according to claim 13, further comprising:
    performing the patterning of the resist layer using electron-beam lithography, wherein the resist layer is an electron beam resist layer; or
    performing the patterning of the resist layer using ultraviolet lithography, wherein the resist layer is a photoresist layer.

* * * * *